United States Patent
Jung et al.

(10) Patent No.: US 9,522,410 B2
(45) Date of Patent: Dec. 20, 2016

(54) APPARATUS AND METHOD FOR DEPOSITING THIN FILM

(71) Applicant: Samsung Display Co., Ltd., Yongin-si, Gyeonggi-do (KR)

(72) Inventors: SukWon Jung, Seoul (KR); YongSuk Lee, Suwon-si (KR); SangHyuk Hong, Suwon-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 736 days.

(21) Appl. No.: 13/745,265

(22) Filed: Jan. 18, 2013

(65) Prior Publication Data

US 2013/0189445 A1    Jul. 25, 2013

(30) Foreign Application Priority Data

Jan. 20, 2012  (KR) ........................ 10-2012-0006547

(51) Int. Cl.

| *B05B 5/00* | (2006.01) |
|---|---|
| *B05D 3/06* | (2006.01) |
| *B05D 1/02* | (2006.01) |
| *B05C 5/00* | (2006.01) |
| *B05B 7/00* | (2006.01) |
| *B05B 7/16* | (2006.01) |
| *H01L 51/56* | (2006.01) |

(Continued)

(52) U.S. Cl.
CPC ............ *B05C 5/001* (2013.01); *B05B 7/0012* (2013.01); *B05B 7/168* (2013.01); *B05D 1/02* (2013.01); *B05D 3/061* (2013.01); *C23C 14/12* (2013.01); *C23C 14/243* (2013.01); *C23C 14/246* (2013.01); *C23C 14/56* (2013.01); *C23C 14/58* (2013.01); *H01L 51/56* (2013.01); *B05B 1/14* (2013.01); *B05B 13/04* (2013.01)

(58) Field of Classification Search
USPC .......... 118/300, 640–643, 323, 321; 427/553
See application file for complete search history.

(56) References Cited

U.S. PATENT DOCUMENTS

| 2003/0077399 A1* | 4/2003 | Potyrailo | ............. | B01J 19/0046 427/532 |
| 2005/0129860 A1* | 6/2005 | Echigo | ..................... | B05D 1/60 427/385.5 |

(Continued)

FOREIGN PATENT DOCUMENTS

| CN | 1381905 | 11/2002 |
| CN | 1782120 | 6/2006 |

(Continued)

OTHER PUBLICATIONS

English Translation JP-2003-243165, Feb. 15, 2002.*

(Continued)

*Primary Examiner* — Yewebdar Tadesse
(74) *Attorney, Agent, or Firm* — Robert E. Bushnell, Esq.

(57) ABSTRACT

A thin film deposition apparatus includes a substrate supporting unit supporting a substrate, a deposition source evaporating a deposition material to supply a steam of the deposition material to the substrate, and a deposition source shifting unit moving the deposition source so that the deposition source is relatively shifted with respect to the substrate supporting unit.

18 Claims, 7 Drawing Sheets

(51) Int. Cl.
*C23C 14/12* (2006.01)
*C23C 14/24* (2006.01)
*C23C 14/56* (2006.01)
*C23C 14/58* (2006.01)
*B05B 1/14* (2006.01)
*B05B 13/04* (2006.01)

(56) References Cited

U.S. PATENT DOCUMENTS

| | | | |
|---|---|---|---|
| 2007/0077367 A1* | 4/2007 | Miura | B41J 2/1433 427/532 |
| 2011/0187798 A1 | 8/2011 | Rogers et al. | |
| 2011/0262650 A1* | 10/2011 | Lee | C23C 16/4486 427/457 |
| 2011/0300306 A1 | 12/2011 | Mohanty | |

FOREIGN PATENT DOCUMENTS

| | | |
|---|---|---|
| CN | 102061445 | 5/2011 |
| JP | 2003-243165 | 8/2003 |
| KR | 10-2003-0073648 A | 9/2003 |
| TW | 550672 | 9/2003 |
| TW | 201127973 | 8/2011 |

OTHER PUBLICATIONS

"Steam." Wikipedia: The Free Encyclopedia. Wikimedia Foundation, Inc. Jan. 22, 2013. Web. 8 Feb. 2013. <http://en.wikipedia.org/wiki/steam>.

"Atomization." Wikipedia: The Free Encyclopedia. Wikimedia Foundation, Inc. Jan. 22, 2013. Web. Feb. 8, 2013. <http://en.wikipedia.org/wiki/Atomization>.

"Deposition Processes." MEMSnet: An Information Portal for the MEMS and Nanotechnology Community. Apr. 5, 2012. <www.memsnet.org/mems/processes/deposition.html>.

* cited by examiner

APPARATUS AND METHOD FOR DEPOSITING THIN FILM

CLAIM OF PRIORITY

This application makes reference to, incorporates the same herein, and claims all benefits accruing under 35 U.S.C. §119 from an application earlier filed in the Korean Intellectual Property Office on the 20 Jan. 2012 and there duly assigned Serial. No. 10-2012-0006547.

BACKGROUND OF THE INVENTION

Field of the Invention

The inventive concepts described herein relate to a substrate treating apparatus, and more particularly, relate to an apparatus enabling the deposition of a thin film.

Description of the Related Art

Among display devices, an organic light emitting display device may use organic light emitting elements, and may have such merits as a wide viewing angle, good contrast, rapid response speed, and the like. For the reason, the organic light emitting display device may attract popular acclaim as a next-generation display device.

SUMMARY OF THE INVENTION

The present invention provides an improved thin film deposition apparatus.

Exemplary embodiments of the inventive concept provide a thin film deposition apparatus including a substrate supporting unit supporting a substrate a deposition source evaporating a deposition material to supply a steam of the deposition material onto a surface of to the substrate, and a deposition source shifting unit moving the deposition source so that the deposition source is shifted relative to the substrate supporting unit.

In exemplary embodiments, the deposition source includes an evaporation room, i.e., an evaporation chamber, where the deposition material is evaporated to generate the steam of the deposition material, a nozzle unit having output holes through which the steam of the deposition material is released to the substrate, a steam supplying unit connecting the evaporation room and the nozzle unit and supplying the steam of the deposition material to the nozzle unit, and a light radiating unit placed at one side of the nozzle unit and radiating light to harden a region of the substrate where the deposition material is deposited.

In exemplary embodiments, the substrate supporting unit supports the substrate in a state where the substrate stands in an up-and-down direction. The deposition source shifting unit shifts the deposition source in the up-and-down direction between upper and lower parts of the substrate. The light radiating wilt is placed in at least one of an upper side or a lower side of the nozzle unit.

In exemplary embodiments, the substrate supporting unit supports the substrate such that a surface on which the deposition material is to be deposited is directed downwards. The nozzle Unit supplies the steam of the deposition material to the substrate which is disposed at a lower side of the substrate supporting unit. The light radiating unit is placed in at least one of a front or a rear of the nozzle unit along a shifting direction of the deposition source.

In exemplary embodiments, the light radiating unit radiates an ultraviolet ray.

In exemplary embodiments, the evaporation room includes a container having an inner space, a spray nozzle joined with the container and atomizing a liquefied deposition material into the inner space of the container, and a first heater surrounding the container and heating the inner space of the container.

In exemplary embodiments, the evaporation room further includes a transfer nozzle meeting the container and the steam supplying unit and has a first inside diameter smaller than an inside diameter of the container. The steam supplying unit includes a supplying nozzle having a first region, a second region, and a third region. The first region is joined to the transfer nozzle and has a second inside diameter that is smaller than the first inside diameter. The second region has a third inside diameter that is larger than the second inside diameter and smaller than the inside diameter of the container and is joined to the nozzle unit. The third region connects the first region and the second region and has an inside diameter. The inside diameter of the third region gradually increases as the third region becomes closer to the second region.

In exemplary embodiments, the steam supplying unit further includes a second heater surrounding the supplying nozzle to heat the supplying nozzle, and a cooling block surrounding the second heater to cool a peripheral region of the second heater.

In exemplary embodiments, the deposition source further includes an evaporation room shifting unit making relative shift of the evaporation room with respect to the steam supplying unit. The steam supplying unit includes a supplying nozzle connecting the container and the nozzle unit and having a wrinkle region, the shape of the wrinkle region being varied according to a shift of the evaporation room.

In exemplary embodiments, the evaporation room further includes a deposition material supplying unit supplying the liquefied deposition material to the spray nozzle, and a gas supplying nun supplying a carrier gas to the spray nozzle.

Exemplary embodiments of the inventive concept also provide a thin film depositing method including evaporating a deposition material to generate steam of the deposition material and to output the steam of the deposition material to one surface of a substrate via an output hole formed at a nozzle unit. The substrate is fixed, and the nozzle unit relatively shifts with respect to the substrate to output the steam of the deposition material.

In exemplary embodiments, the nozzle unit shifts in a straight line from one end of the substrate to the other end of the substrate.

In exemplary embodiments, the substrate is supported at a state that the substrate stands in an up-and-down direction, and the nozzle unit shifts between a lower part and an upper part of the substrate.

In exemplary embodiments, the substrate is disposed such that a surface of the substrate where the deposition material is deposited is directed downwards, and the nozzle unit shifts at a lower side of the substrate.

In exemplary embodiments, a light radiating unit is prepared in at least one of a front or a rear of the nozzle unit along a shifting direction of the nozzle unit, and the light radiating unit shifts together with the nozzle unit such that a light is radiated on a region of the substrate where the deposition material is deposited.

In exemplary embodiments, the light radiating unit radiates an ultraviolet ray.

In exemplar embodiments, the deposition material is evaporated by atomizing a liquefied deposition material into a container using a spray nozzle having an inside diameter smaller than an inside diameter of the container, and heating an inner space of the container.

In exemplary embodiments, the liquefied deposition material is sprayed into the inner space of the container together with a carrier gas.

In exemplary embodiments, the carrier gas includes an inert gas.

BRIEF DESCRIPTION OF THE DRAWINGS

A more complete appreciation of the invention, and any of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
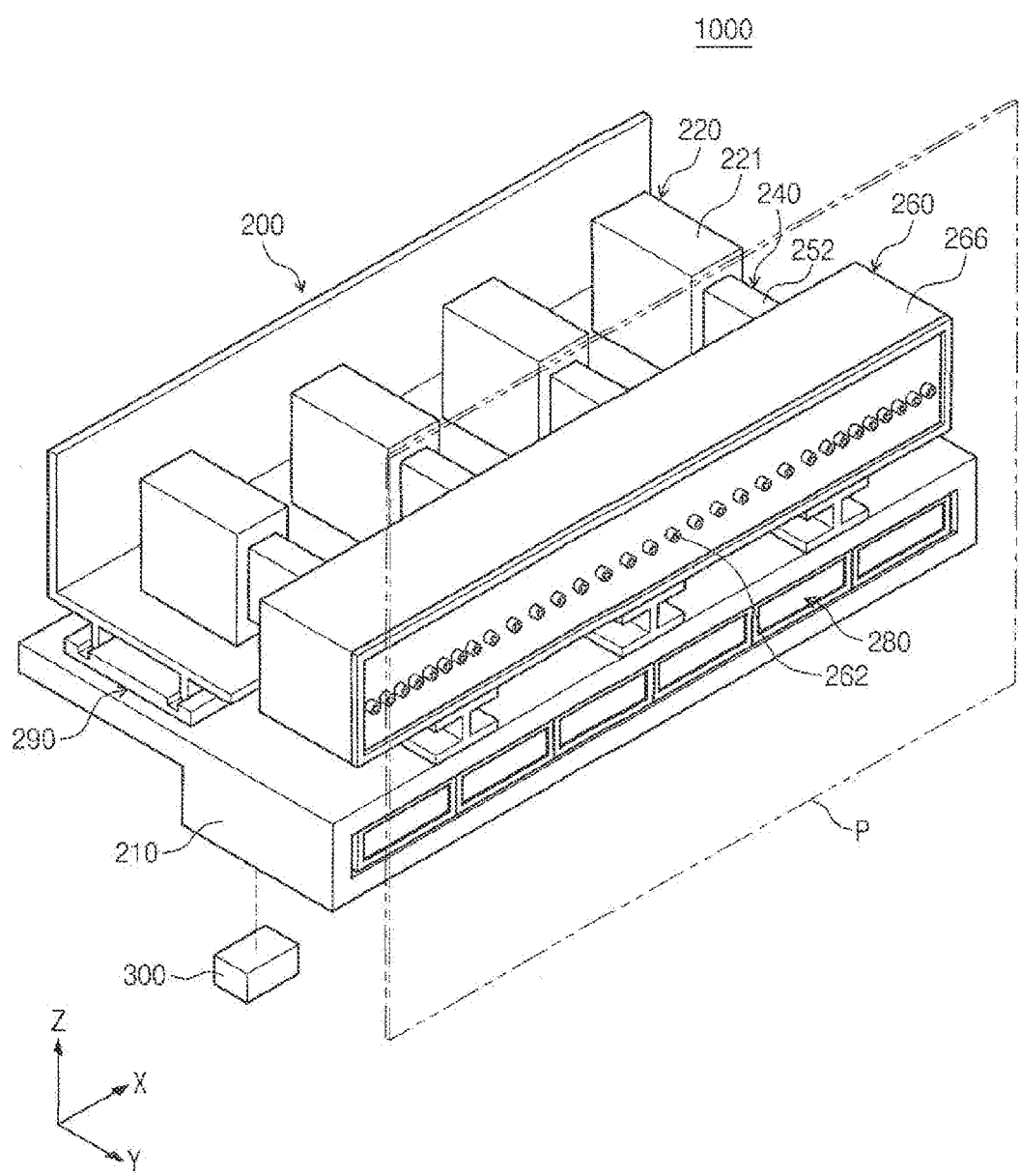
FIG. 1 is an oblique view illustrating a thin film deposition apparatus constructed as an embodiment according to the principles of the present invention.

In a conventional organic light emitting display device, a visible ray may be generated by recombination of holes and electrons respectively injected to an anode electrode and a cathode electrode, at an organic light emitting layer. A light emitting characteristic may be improved by selectively inserting organic layers such as an electron injection layer, an electron transfer layer, a hole transfer layer, a hole injection layer, etc., between the anode electrode and the cathode electrode together with an organic light emitting layer.

The electrodes, the organic light emitting layer, and the organic layers of the organic light emitting display device may be formed by various methods. One of the methods may be a deposition method. With the deposition method, a steam of a deposition material may be supplied to a substrate, and the deposition material may be hardened by irradiating a light onto a surface of the substrate on which the deposition material is deposited. A thin film deposition apparatus may include a deposition unit depositing a deposition material and a hardening unit hardening the deposited material. The deposition unit and the hardening unit may be implemented by separate chambers. This may make a total length of the apparatus increase. In particular, in a case where the thin film deposition apparatus treats a large-sized substrate, foot print and tact time may increase.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms an only used to distinguish one element, component, region or section from another region layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be farther understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
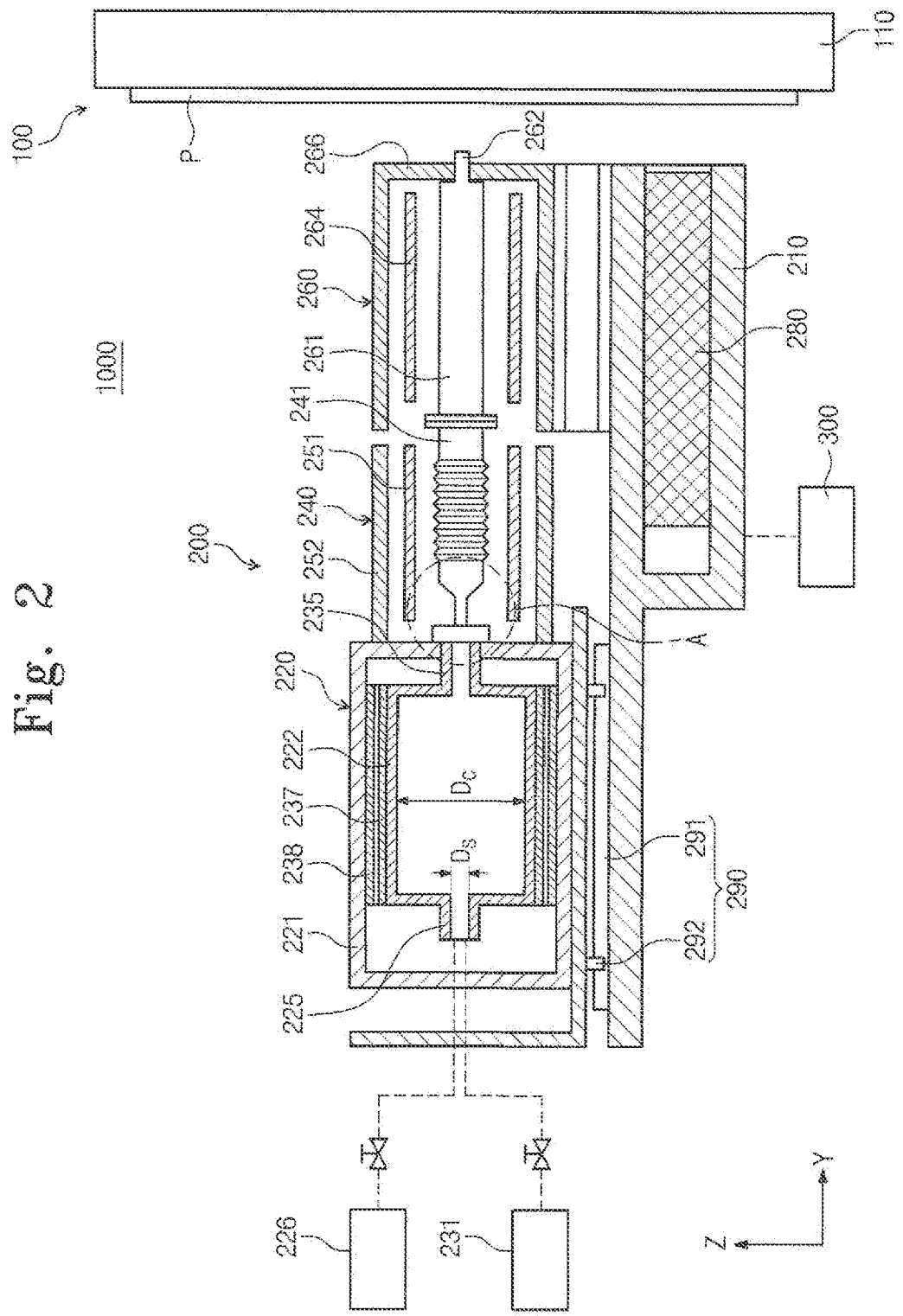
FIG. 2 is a cross-sectional view of the thin film deposition apparatus in FIG. 1.

FIG. 1 is an oblique view illustrating a thin film deposition apparatus constructed as an embodiment according to the principles of the present invention. FIG. 2 is a cross-sectional view of the thin film deposition apparatus in FIG. 1.

Referring to FIGS. 1 and 2, a thin film deposition apparatus 1000 may supply a substrate P with a steam of a deposition material to form a thin film on one surface of the substrate P. The thin film deposition apparatus 1000 may include a substrate supporting unit 100, a deposition source 200, and a deposition source shifting unit 300. The substrate P may include a substrate for a flat display device, a mother glass capable of forming a plurality of flat display devices. The deposition source 200 may evaporate a deposition material, to supply the substrate P with a steam of the deposition material. The deposition material may include an organic thin film material for an organic light emitting element. The deposition material may be provided by mixing a charge transfer material, a charge generating material, and a light emitting material. The deposition source shifting unit 300 may make relative shift of the deposition source 300 with respect to the substrate supporting unit 100. In the present specification and the pending claims, the term "steam" refers to a colloid suspension of liquid droplets in a gas.

The substrate supporting unit 100 may be fixed, and may support the substrate P. The substrate supporting unit 100 may include a rectangular support plate 110, which has an area wider than the substrate P. The substrate P may be fixed at one surface of the support plate 110 to be supported by the support plate 110. The support plate 110 can support the substrate P using an electrostatic force or mechanically. One surface of the support plate 110 may be disposed in an up-and-down direction to support the substrate P. The substrate P may be supported by the support plate 110 at a condition that the substrate P stands in the up-and-down direction. In the present specification and pending claims, the "up-and-down direction" refers to a vertical direction which is aligned with the gradient of the gravity field.

The deposition source 200 may be located at one side of the substrate supporting unit 100. The deposition source 200 may be located to be adjacent to one surface of the support plate 110 supporting the substrate P. The deposition source 200 may include a base 210, an evaporation room 220, a steam supplying unit 240, a nozzle unit 260, a light radiating unit 280, and an evaporation mom shifting unit 290. The base 210 may support elements of the deposition source 200. The constituent elements 220, 240, 260, 280, and 290 may be installed at the base 210. The evaporation room 220 may evaporate a deposition material. The steam supplying unit 240 may supply the nozzle unit 260 with a steam of the deposition material. The nozzle unit 260 may output the steam of the deposition material to the substrate P. The light radiating unit 280 may radiate a light to a region of the substrate P where the deposition material is to be deposited. The evaporation room shifting unit 290 may make relative shift of the evaporation room 220 with respect to the steam supplying unit 240.

The evaporation room 220 may be formed of a plurality of evaporation rooms that are disposed in line along a direction. Each evaporation room 220 may evaporate the deposition material to supply a steam of the deposition material to the steam supplying unit 240. Hereinafter, a direction where the evaporation rooms 220 are arranged may be referred to as a first direction X. A direction vertical to the first direction X when viewing from a top may be referred to a second direction Y. A direction vertical to the first and second directions X and Y may be referred to a third direction Z. The second direction Y may be parallel with a direction where the evaporation room 220, the steam supplying it 240, and the nozzle unit 260 are arranged. The third direction Z may be parallel with the up-and-down direction. Each evaporation room 220 may be configured to have the same structure.

The evaporation room 220 may include a chamber 221, a container 222, a spray nozzle 225, a deposition material supplying unit 226, a carrier gas supplying unit 231, a transfer nozzle 235, a first heater 237, and a cooling block 238.

The chamber 221 may provide an internal space. Various devices may be provided within the chamber 221. The container 222 may be located within the chamber 221. A space may be formed within the container 222. An inner space of the container 222 may be provided as a space where a deposition material is evaporated by a steam. The spray nozzle 225 may be coupled at the rear of the container 222, and the transfer nozzle 235 may be coupled at the front of the container 222. The inside diameter Ds of the spray nozzle 225 may be smaller than the inside diameter De of the container 222. The spray nozzle 225 may atomize a liquefied deposition material to be supplied to an inner space of the container 222. The spray nozzle 225 may include an atomizer.

The deposition material supplying unit 226 and the carrier gas supplying unit 231 may be joined to the spray nozzle 225. The deposition material supplying unit 226 may supply a liquefied deposition material to the spray nozzle 225, and the carrier gas supplying unit 231 may supply the spray nozzle 225 with a carrier gas. The carrier gas may include an inert gas. The spray nozzle 225 may be supplied with the liquefied deposition material and the carrier gas together.

The liquefied deposition material and the carrier gas may be compressed when they pass through the spray nozzle 225, and volumes thereof may be swelled when they are supplied into the container 222. Thus, the liquefied deposition material and the carrier gas may be atomized. The carrier gas may be supplied by a high pressure so as to prevent the spray nozzle 225 from being clogged by the deposition material.

The first heater 237 may be provided to surround the container 222. An inner space of the container 222 may be heated by the first heater 237. The atomized deposition material may be heated by the first heater 237 so as to stay within the container 222 by a steam state.

An inner pressure of the container 222 may increase in proportion to a steam amount of the deposition material staying within the container 222. As an inner pressure of the container 222 increases, a steam of the deposition material may be supplied to the transfer nozzle 235.

Figure 3:
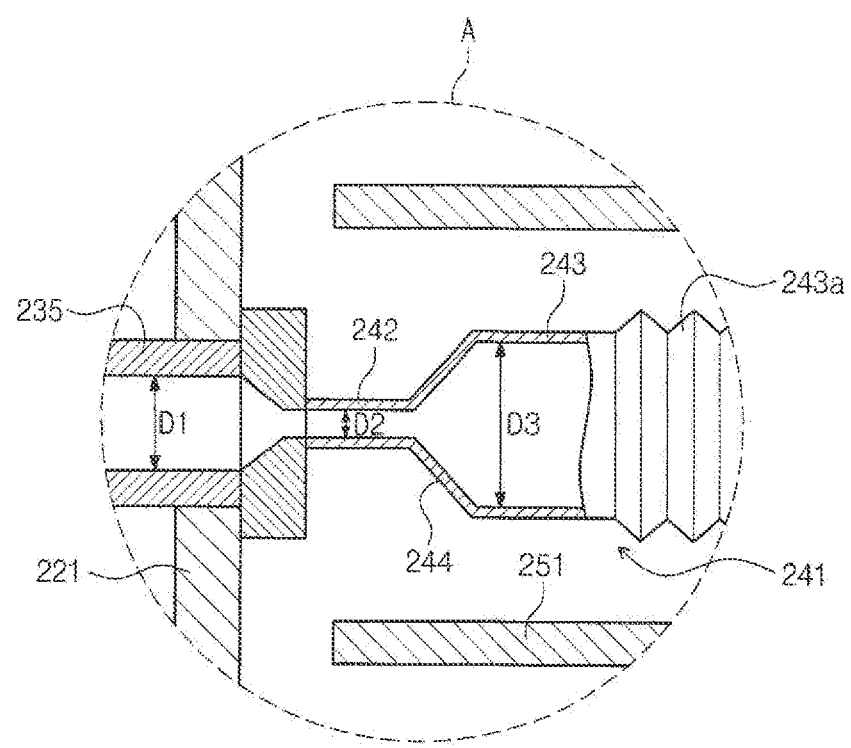
FIG. 3 is an enlarged view of a region A in FIG. 2.

FIG. 3 is an enlarged view of a region A in FIG. 2. Referring to FIGS. 1 to 3, a transfer nozzle 235 may have a first inside diameter D1 smaller than the inside diameter Dc of a container 222. A steam of a deposition material may be compressed when it passes through the transfer nozzle 235.

A cooling block 238 may be provided to surround a first heater 237. The cooling block 238 may cool a peripheral region of the first heater 237. The cooling block 238 may prevent peripheral devices from being heated by the first heater 237.

A steam supplying unit 240 may be connected to evaporation rooms 220, respectively. The steam supplying unit 240 may be disposed at a front of the evaporation room 220 in a second direction Y. The steam supplying unit 240 may include a supplying nozzle 241, a second heater 251, and a cooling block 252.

The supplying nozzle 241 may be joined to the transfer nozzle 235. The supplying nozzle 241 may have a first region 242, a second region 243, and a third region 244. The first region 242 may be connected with the transfer nozzle 235, and may have a second inside diameter D2 smaller than a first diameter D1 of the transfer nozzle 235. The second region 243 may have a third inside diameter D3 larger than the second inside diameter D2 of the first region 242 and smaller than the inside diameter Dc of the container 222. The third region 244 may be placed between the first region 242 and the second region 243, and may connect the first region 242 and the second region 243. The inside diameter of the third region 244 may gradually increase as it gets closer to the second region 243 in direct proportion to the separation between the second and third regions 243 and 244. That is, the third region 244 may have a funnel shape. When passing through the first region 242, a steam of a deposition material may be recompressed. When passing through the third region 244 and the second region 243, a volume of the steam of the deposition material may be expanded. With the above-described process, the deposition material may stay at a steam state. The second region 243 may have a wrinkle region 243a. A shape of the wrinkle region 243a may be varied according to a shift of an evaporation room 220. The evaporation room 220 may be aligned on the same line as the steam supplying unit 240 upon shifting in a first direction X. At this time, a shape of the wrinkle region 243a may be varied according to a shift of the evaporation room 220.

The second heater 251 may he provided around the supplying nozzle 241 to surround the supplying nozzle 241. The interior of the supplying nozzle 241 may be heated by the second heater 251. A steam of a deposition material remaining within the supplying nozzle 241 may be reheated by the second heater 251 so as to retain a steam state.

The cooling block 252 may he provided to surround the second heater 251. The cooling block 252 may cool a peripheral region of the second heater 251. The cooling block 252 may prevent peripheral devices from being heated by the second heater 251.

A nozzle unit 260 may be placed at the front of the steam supplying unit 240, and may be connected with the steam supplying unit 240. The nozzle unit 260 may include an output nozzle 261, a third heater 264, and a cooling block 266.

The output nozzle 261 may be formed of a plurality of output nozzles, which are disposed in parallel along the first direction X. The output nozzles 251 may be placed within a range corresponding to a width of a substrate P in the first direction X. The output nozzles 261 may be connected with the supplying nozzle 241. An output hole 262 may be formed at the front of the output nozzle 261 so as to output a steam of a deposition material. The steam of the deposition material may be supplied to a region corresponding to a first-direction width of the substrate P.

The third heater 264 may be provided around the output nozzle 261 to surround the output nozzle 261. The interior of the output nozzle 261 may be heated by the third heater 264. A steam of a deposition material remaining within the output nozzle 261 may be reheated by the third heater 261 so as to retain a steam state.

The cooling block 266 may be provided to surround the third heater 264. The cooling block 266 may cool a peripheral region of the third heater 264. The cooling block 266 may prevent peripheral devices from being heated by the third heater 264.

A light radiating unit 280 may radiate a light to a region of the substrate P where a deposition material is to be deposited. The light radiating unit 280 may be formed of a plurality of light radiating units, which are disposed to be spaced apart in the first direction X. The light radiating units 280 may be disposed within a width corresponding to a width where the output nozzles 261 are disposed in the first direction X. The light radiating unit 280 may be placed at a lower part of the nozzle unit 260 so as to he spaced apart from the nozzle unit 260. The light radiating unit 280 may radiate an ultraviolet light. The light radiating unit 280 may include an ultraviolet light emitting diode (UV LED). A deposition material deposed on the substrate P may be hardened by a light radiated from the light radiating unit 280.

An evaporation room shifting unit 290 may shift the evaporation rooms 220 in the first direction X such that the evaporation rooms 220, the steam supplying unit 240, and the nozzle units 260 are aligned on the same line. The evaporation room shifting unit 290 may include a support plate 291 and a guide rail 292. The support plate 291 may be fixed at an upper surface of the base 210. The support plate 291 may be disposed along the first direction X. The guide rail 292 may be placed at the support plate 291, and may be provided to be movable in the first direction X. The evaporation rooms 220 may be aligned by a shift of the guide rail 292.

A deposition source shifting unit 300 may shift a deposition source 200. The deposition source shifting unit 300 may make scan shift on the deposition source 200 in a third direction Z. The deposition source shifting unit 300 may be joined with the base 210, and may shift the base 210. Upon shifting of the base 210, the evaporation rooms 220, the steam supplying unit 240, the nozzle unit 260, the light radiating unit 280, and the evaporation room shifting unit 290 may be shifted as one body. The deposition source shifting unit 300 may shift the deposition source 200 within a range between upper and lower parts of the substrate P. When the deposition source 200 is shifted, the nozzle unit 260 may output a steam of a deposition material to the substrate P. The light radiating unit 280 may shift along the nozzle unit 260 such that a light is radiated to a region of the substrate P where a deposition material is to be deposited. Since the nozzle unit 200 and the light radiating unit 280 are shifted together, depositing and hardening of a deposition material may be executed at the same time. For example, the deposition source shifting unit 300 may include a guide rail disposed along the third direction Z, so that the deposition source may be movable along the guide rail in the third direction Z.

Below, a thin film depositing method using the above-described thin film deposition apparatus will be more fully described with reference to accompanying drawings.

Figure 4:
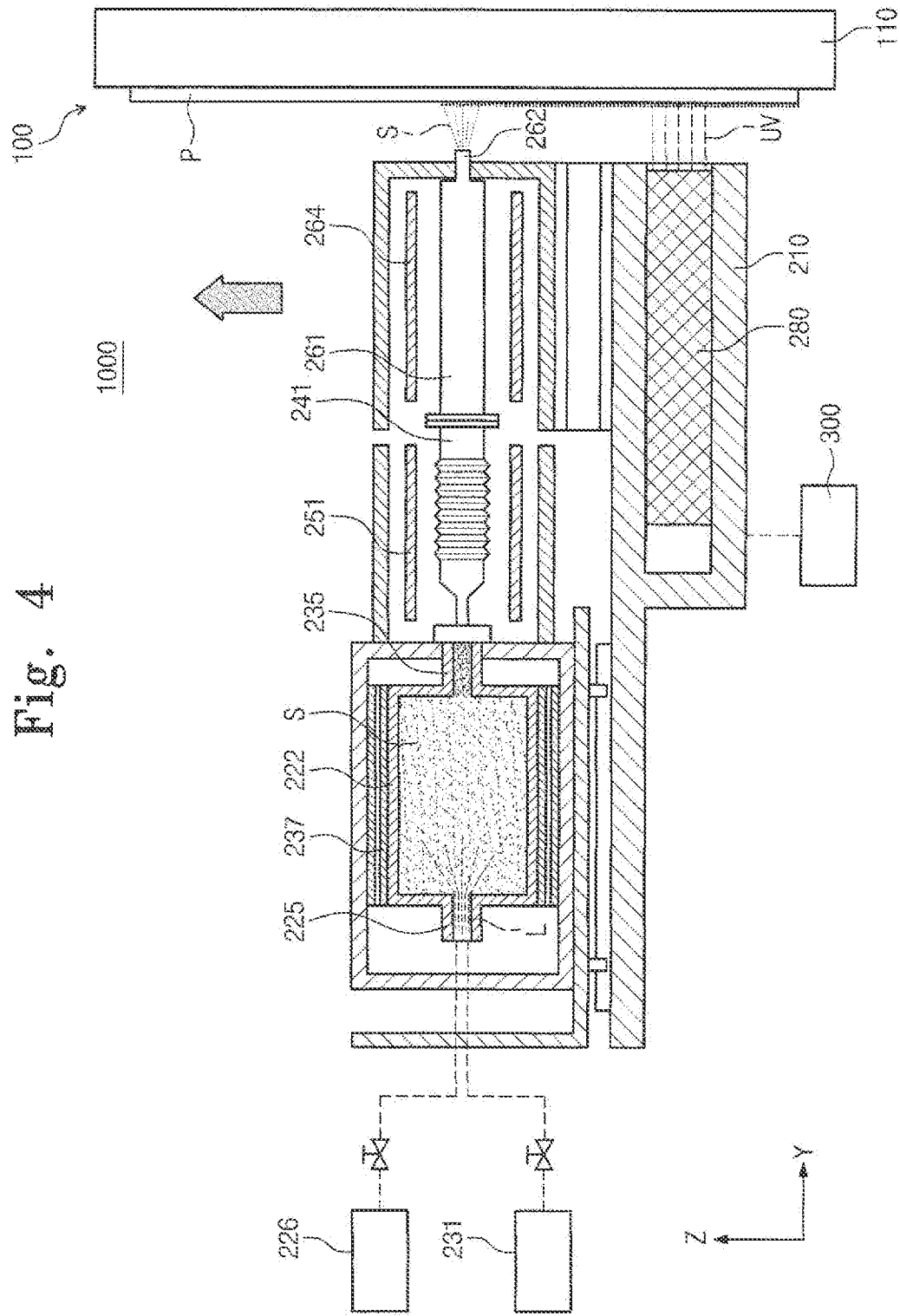
FIG. 4 is a diagram describing a thin film depositing method of a thin film deposition apparatus as an embodiment according to the principles of the present invention.

FIG. 4 is a diagram describing a thin film depositing method of a thin film deposition apparatus as an embodiment of the inventive concept.

Referring to FIG. 4, a substrate P standing in an up-and-down direction may be supported by a support plate 110. A liquefied deposition material may be supplied from a deposition material supplying unit 226, and a carrier gas may be provided from a carrier gas supplying unit 231. A carrier gas may be in a high-pressure gas. The liquefied deposition material L and the carrier gas may be compressed when passing through a spray nozzle 225, and then may be supplied into a container 222. When supplied into the container 222, the liquefied deposition material L and the carrier gas may be expanded to be atomized. An inner space of the container 222 may be heated by the first heater 237. The atomized deposition material thus heated may stay within the container 222 in a steam state.

An inner pressure of the container 222 may become high in proportion to an increase in a steam amount of the deposition material remaining within the container 222, so that the steam S of the deposition material flows into a transfer nozzle 235. The steam S of the deposition material may be supplied to the transfer nozzle 235, a supplying nozzle 241, and an output nozzle 261 in this order. When passing through the transfer nozzle 235 and the supplying nozzle 241, the steam S of the deposition material may be re-compressed and re-expanded. The steam S of the deposition material may be heated by the first heater 237, the second heater 251 and the third heater 264 to be retained at a steam state. The steam S of the deposition material may be output via an output hole 262 of the output nozzle 261 to be deposited on the substrate P.

While the steam S of the deposition material is output, a deposition source shifting unit 300 may shift a deposition source 200 in a third direction Z. The deposition source shifting unit 300 may make scan shift on the deposition source 200 to an upper part of the substrate P from a lower part thereof along the third direction Z. The nozzle unit 260 may be shifted in a straight line to the upper part of the substrate P from the lower part thereof so as to output the steam of the deposition material. The steam of the deposition material from the output nozzle 261 may be deposited on the substrate P in a lower-to-upper direction. A light radiating unit 280 may be shifted with the output nozzle 261 from a lower part of the output nozzle 261 so as to radiate an ultraviolet ray to a region of the substrate P where a deposition material is deposited. Processes of forming and hardening a thin film may be performed at one step by depositing a steam S of a deposition material on a substrate P and then radiating an ultraviolet ray to a deposition region of the substrate P.

Figure 5:
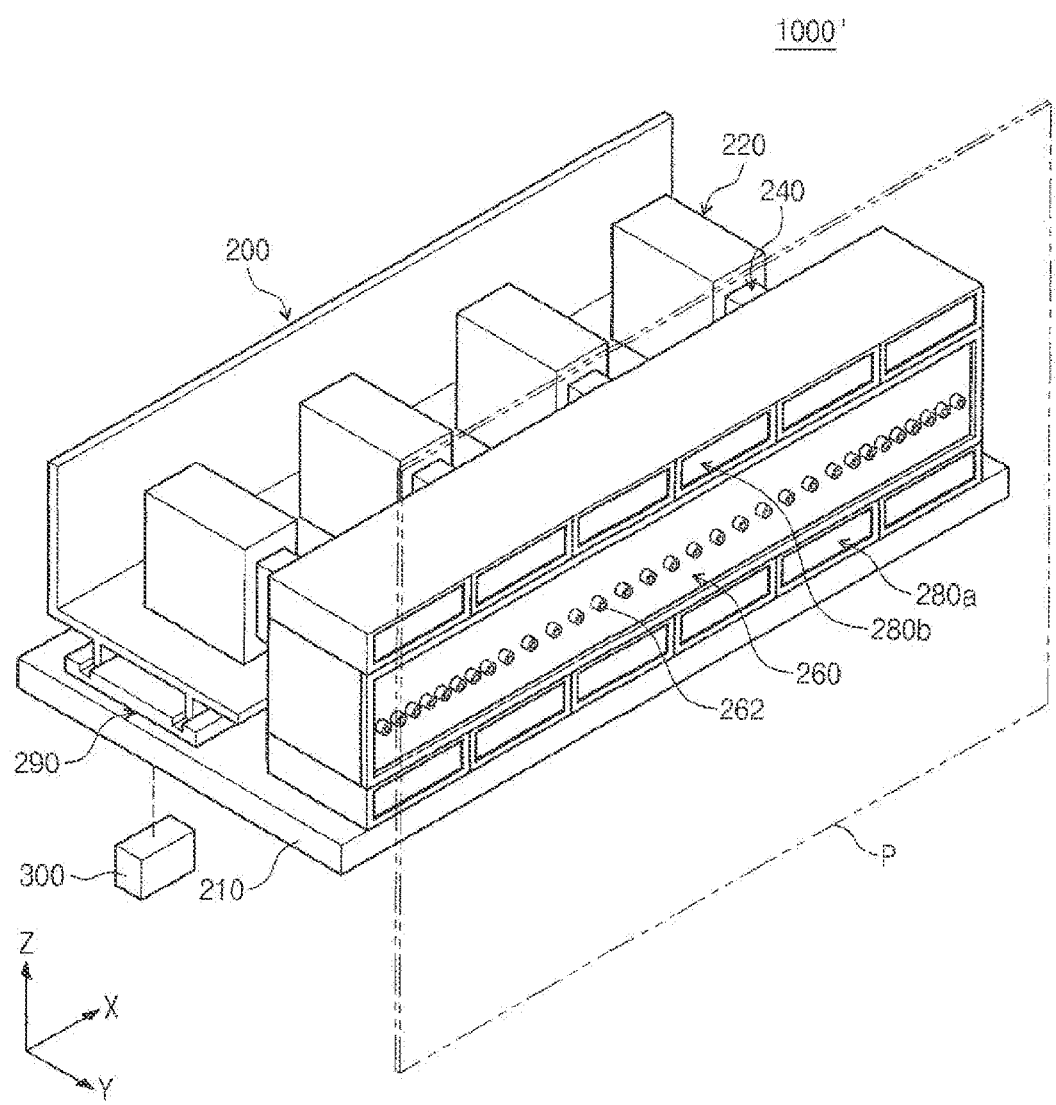
FIG. 5 is an oblique view of a thin film deposition apparatus constructed as another embodiment according to the principles of the present invention.

FIG. 5 is an oblique view of a thin film deposition apparatus constructed as another embodiment according to the inventive concept.

Unlike a thin film deposition apparatus in FIG. 1, referring to FIG. 5, light radiating units 280a and 280b may be provided at upper and lower parts of a nozzle unit 260. In case that a deposition source 200 descends to a lower region of a substrate P from an upper region, the light radiating unit 280b placed at the upper part of the nozzle unit 260 may radiate a light to a region of the substrate P where a deposition material is deposited. In case that the deposition source 200 ascends to the upper region of the substrate P from the lower region, the light radiating unit 280a placed at the lower part of the nozzle unit 260 may radiate a light to a region of the substrate P where a deposition material is deposited. Since the light radiating units 280a and 280b placed at upper and lower parts of the nozzle unit 260 selectively radiate a light according to a shifting direction of the deposition source 200, it is possible to reduce a shift number of the deposition source 200 when a plurality of substrates are processed.

Figure 6:
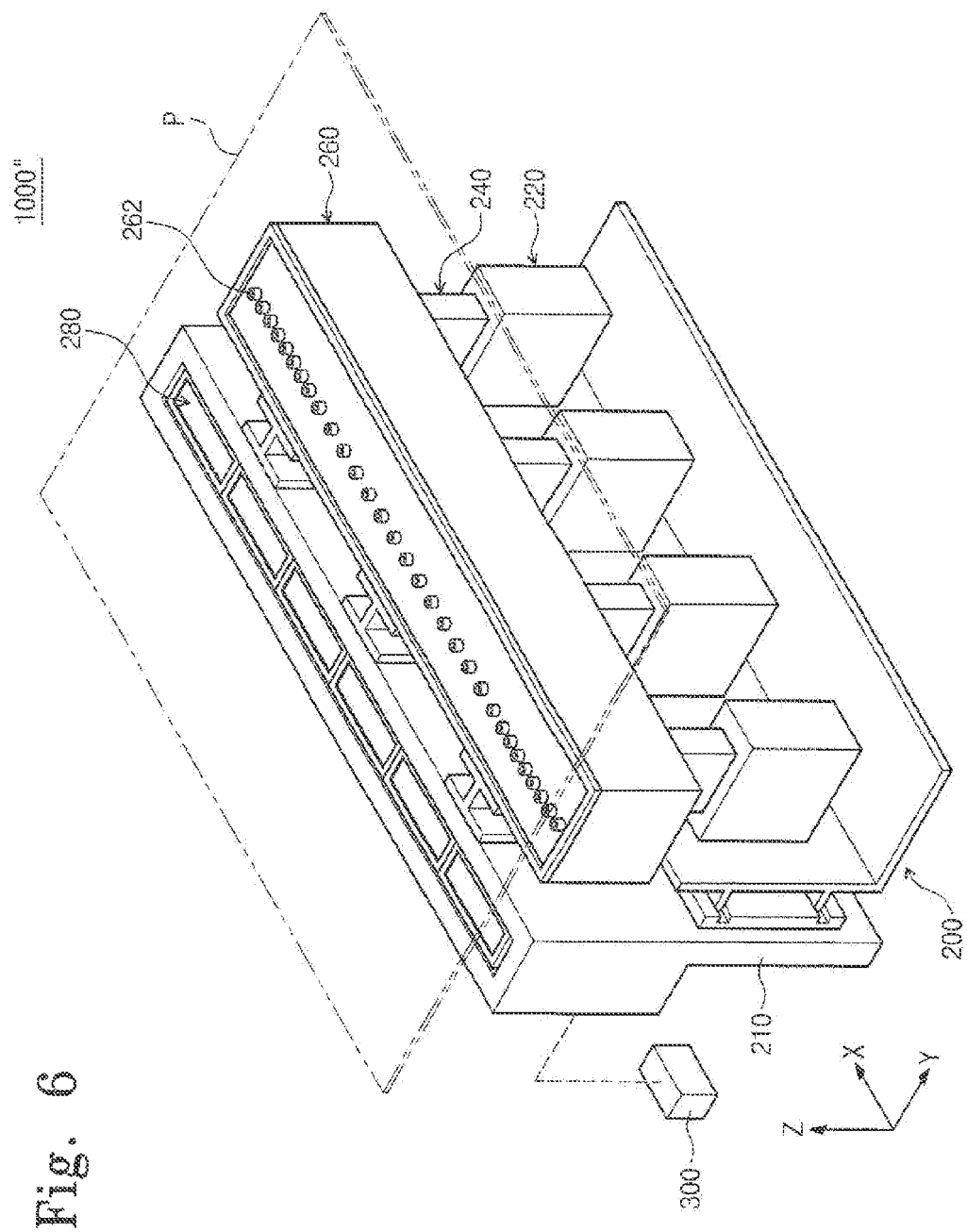
FIG. 6 is an oblique view of a thin film deposition apparatus constructed as still another embodiment according to the principles of the present invention.
Figure 7:
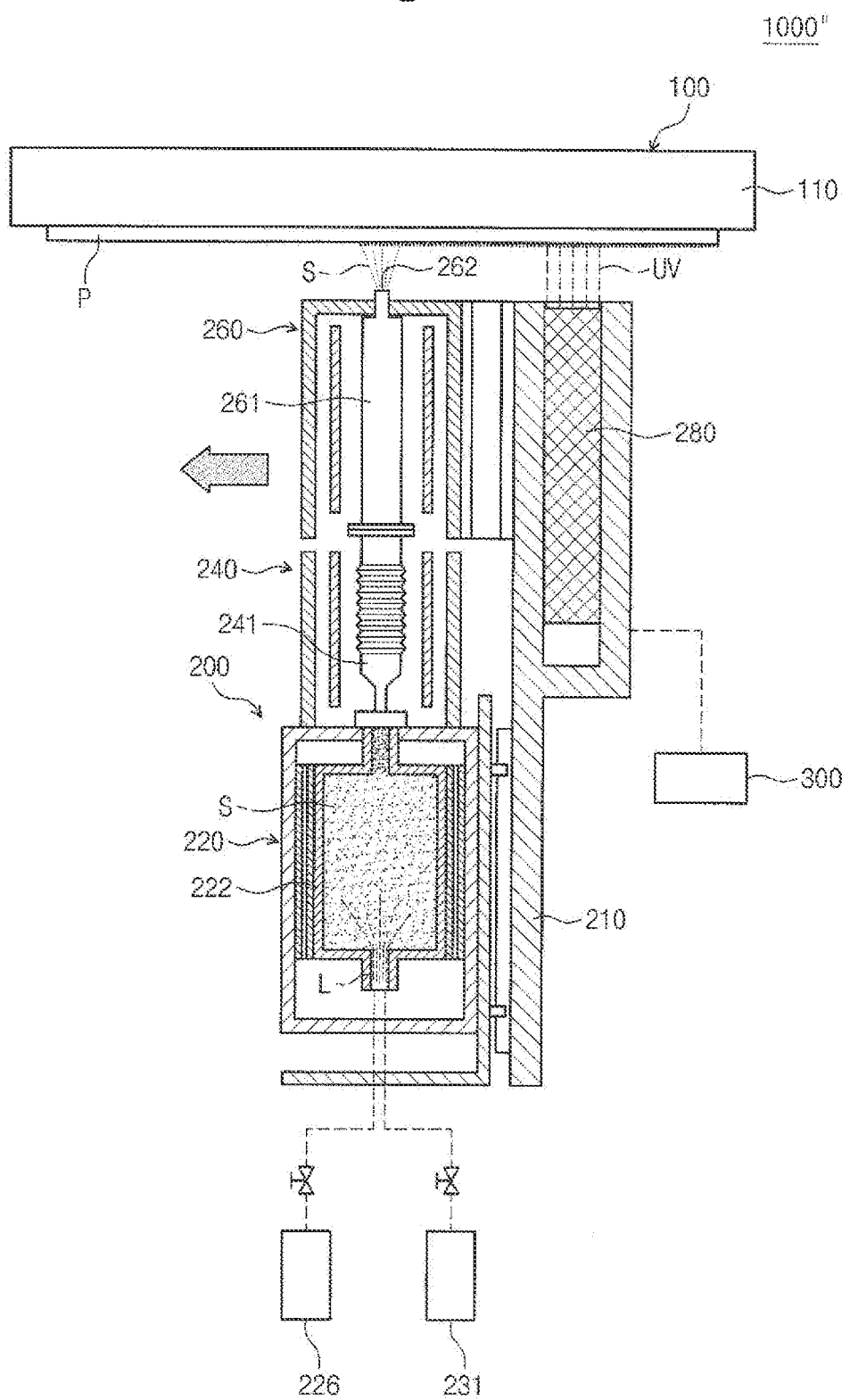
FIG. 7 is a cross-sectional view indicating the thin film deposition apparatus in FIG. 6.

FIG. 6 is an oblique view of a thin film deposition apparatus constructed as still another embodiment according to the principles of the present invention. FIG. 7 is a cross-sectional view indicating the thin film deposition apparatus in FIG. 6.

Referring to FIGS. 6 and 7, a substrate supporting unit 100 may be fixed at an upper part of a deposition source 200 in a third direction Z. A substrate P may be fixed at a lower surface of the substrate supporting unit 100. The substrate P may be supported such that a surface, on which a deposition material is deposited, is directed downwards.

The deposition source 200 may supply a steam S of a deposition material to a lower surface of the substrate P. An evaporation room 220, a steam supplying unit 240, and a nozzle unit 260 may be disposed sequentially in an up-and-down direction. An output hole 262 of an output nozzle 261 may be disposed to be directed toward a lower surface of the substrate P. A deposition source shifting unit 300 may shift the deposition source 200 in a straight line from one end of the substrate P to the other end thereof. A light radiating unit 280 may be prepared on at least one of the front and the rear of the nozzle unit 260. The light radiating unit 280 may be shifted together with the output nozzle 261, and may radiate a light to region of the substrate P where a deposition material is to be deposited.

A thin film deposition apparatus according to embodiments of the inventive concept may be selectively used according to a size and a weight of a substrate P. The size and weight of the substrate P may increase according to a demand of a large-sized display device. In case that it is difficult to use a substrate supporting method described in FIG. 7 due to a weight of a large-sized substrate, a substrate may be supported at a state where it stands as described in relation to FIGS. 1 to 5. In this case, a substrate supporting unit 100 may support the substrate P without affect due to its weight. Further, it is possible to prevent the substrate P from being warped due to the deadweight. As a result, a deposition material may be uniformly deposited on each region of the substrate P.

Since a deposition source 200 may be relatively shifted with respect to a substrate supporting unit 100 that is fixed, it is possible to effectively deposit a deposition material on a large-sized substrate P. Unlike, in case that a substrate supporting unit 100 may be relatively shifted with respect to a deposition source 200 that is fixed, it is not easy to shift a large-sized substrate P. Further, since depositing and hardening of a deposition material are performed sequentially within a chamber, it is possible to reduce foot print and tact time of an apparatus.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:
1. A thin film deposition apparatus, comprising:
a substrate supporting unit supporting a substrate;
a deposition source evaporating a deposition material to supply steam of the deposition material onto a surface of the substrate, the deposition source comprising:
a nozzle unit having output holes through which the steam of the deposition material is output to the substrate;
a light radiating unit coupled to the nozzle unit, and radiating light to harden a region of the substrate where the deposition material is deposited;

an evaporation room where the deposition material is evaporated to generate the steam of the deposition material; and a steam supplying unit connecting the evaporation room to the nozzle unit, and supplying the steam of the deposition material to the nozzle unit; and a deposition source shifting unit moving the deposition source so that the deposition source is shifted relative to the substrate supporting unit.

2. The thin film deposition apparatus of claim 1, wherein the substrate supporting unit supports the substrate in a state where the substrate stands in an up-and-down direction, the deposition source shifting unit shifts the deposition source in the up-and-down direction between upper and lower parts of the substrate, and the light radiating unit is placed in at least one of an upper side or a lower side of the nozzle unit.

3. The thin film deposition apparatus of claim 1, wherein the substrate supporting unit supports the substrate such that a surface on which the deposition material is to be deposited is directed downwards, the nozzle unit supplies the steam of the deposition material to the substrate which is disposed at a lower side of the substrate supporting unit, and the light radiating unit is placed in at least one of a front or a rear of the nozzle unit along a shifting direction of the deposition source.

4. The thin film deposition apparatus of claim 1, wherein the light radiating unit radiates an ultraviolet ray.

5. The thin film deposition apparatus of claim 1, wherein the evaporation room comprises:
a container having an inner space;
a spray nozzle joined with the container and atomizing a liquefied deposition material into the inner space of the container; and
a first heater surrounding the container and heating the inner space of the container.

6. The thin film deposition apparatus of claim 5, wherein the evaporation room further comprises a transfer nozzle connecting the container to the steam supplying unit, the transfer nozzle having a first inside diameter smaller than an inside diameter of the container; and
the steam supplying unit comprises a supplying nozzle having a first region, a second region, and a third region,
the first region is joined to the transfer nozzle, and has a second inside diameter smaller than the first inside diameter,
the second region is joined to the nozzle unit, and has a third inside diameter larger than the second inside diameter, the third inside diameter being smaller than the inside diameter of the container, and
the third region connects the first region to the second region, and has an inside diameter, the inside diameter of the third region gradually increasing as proceeding from the first region to the third region.

7. The thin film deposition apparatus of claim 6, wherein the steam supplying unit further comprises:
a second heater surrounding the supplying nozzle to heat the supplying nozzle; and
a cooling block surrounding the second heater to cool a peripheral region of the second heater.

8. The thin film deposition apparatus of claim 5, wherein:
the deposition source further comprises an evaporation room shifting unit making relative shift of the evaporation room with respect to the steam supplying unit; and the steam supplying unit comprises a supplying nozzle connecting the container and the nozzle unit and having a wrinkle region, the shape of the wrinkle region being varied according to a shift of the evaporation room.

9. The thin film deposition apparatus of claim 5, wherein the evaporation room further comprises:
a deposition material supplying unit supplying the liquefied deposition material to the spray nozzle; and
a gas supplying unit supplying a carrier gas to the spray nozzle.

10. A thin film depositing method, comprising:
evaporating a deposition material to generate steam of the deposition material and to output the steam of the deposition material to a surface of a substrate via output holes formed at a nozzle unit by a thin film deposition apparatus that comprises:
a substrate supporting unit supporting the substrate;
a deposition source evaporating the deposition material to supply the steam of the deposition material onto the surface of the substrate, the deposition source comprising:
the nozzle unit having the output holes through which the steam of the deposition material is output to the substrate;
a light radiating unit coupled to the nozzle unit, and radiating light to harden a region of the substrate where the deposition material is deposited;
an evaporation room where the deposition material is evaporated to generate the steam of the deposition material; and
a steam supplying unit connecting the evaporation room to the nozzle unit, and supplying the steam of the deposition material to the nozzle unit; and
a deposition source shifting unit moving the deposition source so that the deposition source is shifted relative to the substrate supporting unit.

11. The thin film depositing method of claim 10, wherein the nozzle unit shifts in a straight line from one end of the substrate to the other end of the substrate.

12. The thin film depositing method of claim 11, wherein the substrate is supported at a state that the substrate stands in an up-and-down direction, and the nozzle unit shifts between a lower part and an upper part of the substrate.

13. The thin film depositing method of claim 11, wherein the substrate is disposed such that a surface of the substrate where the deposition material is deposited is directed downwards, and the nozzle unit shifts at a lower side of the substrate.

14. The thin film depositing method of claim 11, wherein the light radiating unit is disposed in at least one of a front or a rear of the nozzle unit along a shifting direction of the nozzle unit.

15. The thin film depositing method of claim 14, wherein the light radiating unit radiates an ultraviolet ray.

16. The thin film depositing method of claim 10, wherein the deposition material is evaporated by atomizing a liquefied deposition material into a container using a spray nozzle having an inside diameter smaller than an inside diameter of the container, and heating an inner space of the container.

17. The thin film depositing method of claim 16, wherein the liquefied deposition material is sprayed into the inner space of the container together with a carrier gas.

18. The thin film depositing method of claim 17, wherein the carrier gas includes an inert gas.

* * * * *